United States Patent [19]

Fountain

[11] Patent Number: 5,039,960

[45] Date of Patent: Aug. 13, 1991

[54] WIDEBAND FEEDFORWARD GALLIUM ARSENIDE AGC CIRCUIT

[75] Inventor: Erik C. Fountain, Fullerton, Calif.

[73] Assignee: Hughes Aircraft Company, Los Angeles, Calif.

[21] Appl. No.: 466,199

[22] Filed: Jan. 17, 1990

[51] Int. Cl.⁵ .............................................. H03H 7/24
[52] U.S. Cl. .................... 333/17.1; 307/264; 330/284
[58] Field of Search ............... 333/17.1, 17.2, 81 R; 330/144, 145, 284; 328/168, 173; 307/540, 549–552; 455/234, 235, 248, 249

[56] References Cited

U.S. PATENT DOCUMENTS 3,624,491  11/1971  Fidi et al. .............................. 333/14
3,748,495   7/1973  Messinger ......................... 328/168 X
3,918,003  11/1975  Seidel ............................... 330/284 X Primary Examiner—Paul Gensler
Attorney, Agent, or Firm—Wanda K. Denson-Low

[57] ABSTRACT

An automatic gain control (AGC) circuit for microwave applications is disclosed. The AGC circuit includes a power divider for splitting the signal to be controlled into two signal paths. In one signal path the signal is passed through a GaAs monolithic attenuator. In the other signal path, an RF detector provides a detector output signal to a shaper circuit, which responds to the detector signal to provide control signals to the attenuator. Thus, the AGC circuit employs a feed forward technique for gain control, to provide fast settling times for the circuit.

13 Claims, 2 Drawing Sheets

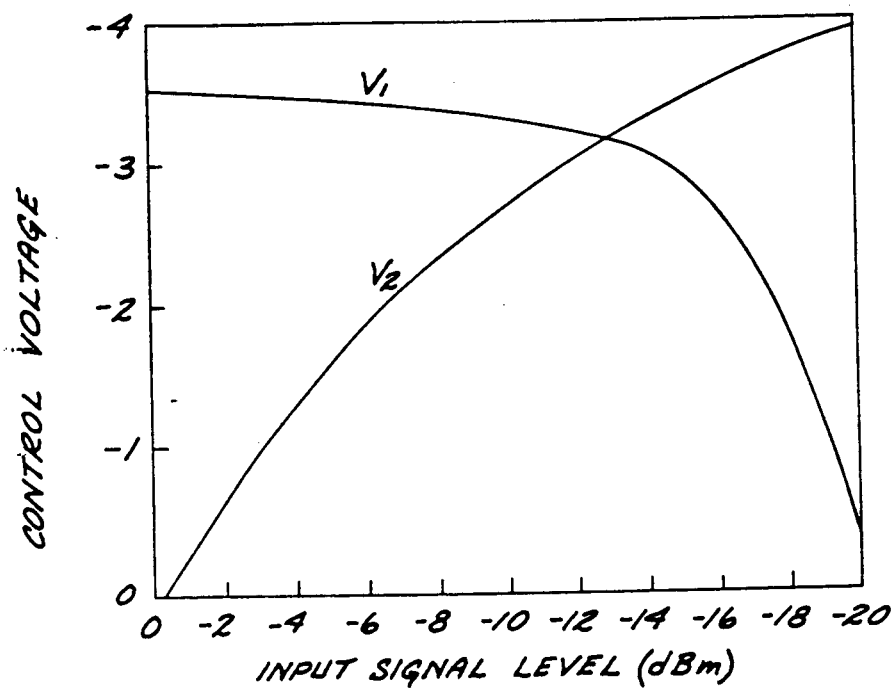
FIG. 3
FIG. 4
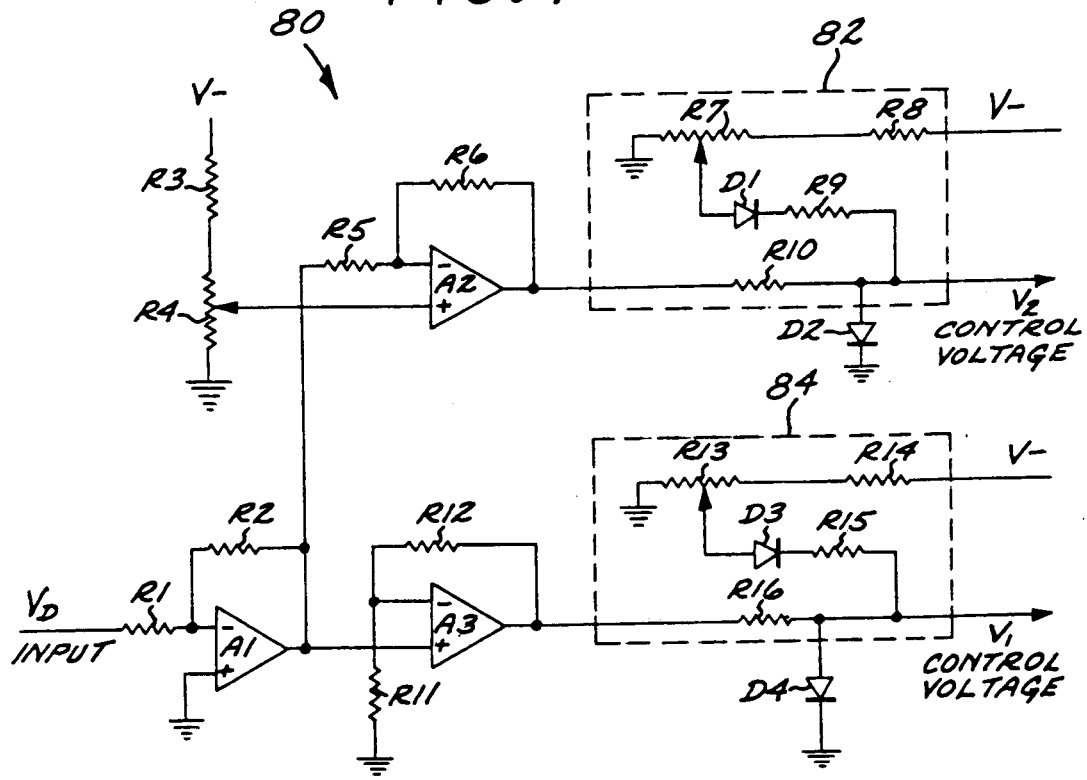

WIDEBAND FEEDFORWARD GALLIUM ARSENIDE AGC CIRCUIT

This invention was made with Government support. The Government has certain rights in this invention.

BACKGROUND OF THE INVENTION

The field of the invention is automatic gain control (AGC) circuits employed in microwave frequency applications.

The function of an AGC circuit is to maintain a constant output level in the presence of varying input levels. Conventional AGC circuits typically employ feedback techniques. Compensation circuits or bandwidth limitations are used to maintain loop stability in the presence of parasitic reactances, resulting in reducing the settling speed of the AGC circuit.

An AGC circuit is described in "A 2 to 8 GHz Leveling Loop Using a GaAs MMIC Active Splitter and Attenuator," Gary S. Barta et al, 1986 Microwave and Millimeter Wave Monolithic Circuits Symposium, pages 75-79. The circuit described used an op-amp feedback loop to provide the proper voltages to a GaAs FET attenuator.

An object of the present invention is to provide a microwave signal automatic gain circuit characterized by fast settling times.

A further object is to provide a microwave signal automatic gain circuit operable over a relatively wide bandwidth and which provides a constant characteristic impedance.

SUMMARY OF THE INVENTION

The invention is an automatic gain circuit (AGC) wherein the AGC attenuation factor is automatically adjusted to compensate for variations in the input signal power so as to maintain a constant output signal level, and which employs a reed- forward control loop to adjust the attenuation factor. Thus, an AGC circuit in accordance with the invention comprises a means for splitting the input microwave signal into first and second signal paths. A variable RF attenuator is disposed in the first signal path to selectively attenuate the microwave signal in the first signal path in response to attenuator control signals, the attenuation factor of the attenuator being dependent on the control signals. In the preferred embodiment, the attenuator comprises a monolithic GaAs voltage controlled device.

The AGC circuit further comprises a feed forward control loop, comprising an RF detector responsive to the microwave signal in the second path for providing a detector signal indicative of the power of the input microwave signal. A circuit means is responsive to the detector signals for generating the attenuator control signals so as to increase or decrease the attenuation factor of the attenuator as required to maintain a constant output signal power level from the attenuator. A main advantage of this AGC circuit is its fast settling time. The settling time of the circuit is significantly faster than conventional circuits using feedback techniques.

A further advantage of the preferred embodiment of the invention is the use of a GaAs attenuator which provides a constant characteristic impedance as the attenuation is varied. The resulting lower phase shift makes the invention particularly useful in applications such as signal combining or radar detection where system phase errors must be tightly controlled.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 3 is a plot of the control voltages as a function of the input signal level for a GaAs attenuator employed in the AGC circuit of FIG. 1.

FIG. 4 is a simplified schematic diagram of a shaper circuit as used in the AGC circuit of FIG. 1.

DETAILED DESCRIPTION OF THE PREFERRED EMBODIMENT

Figure 1:
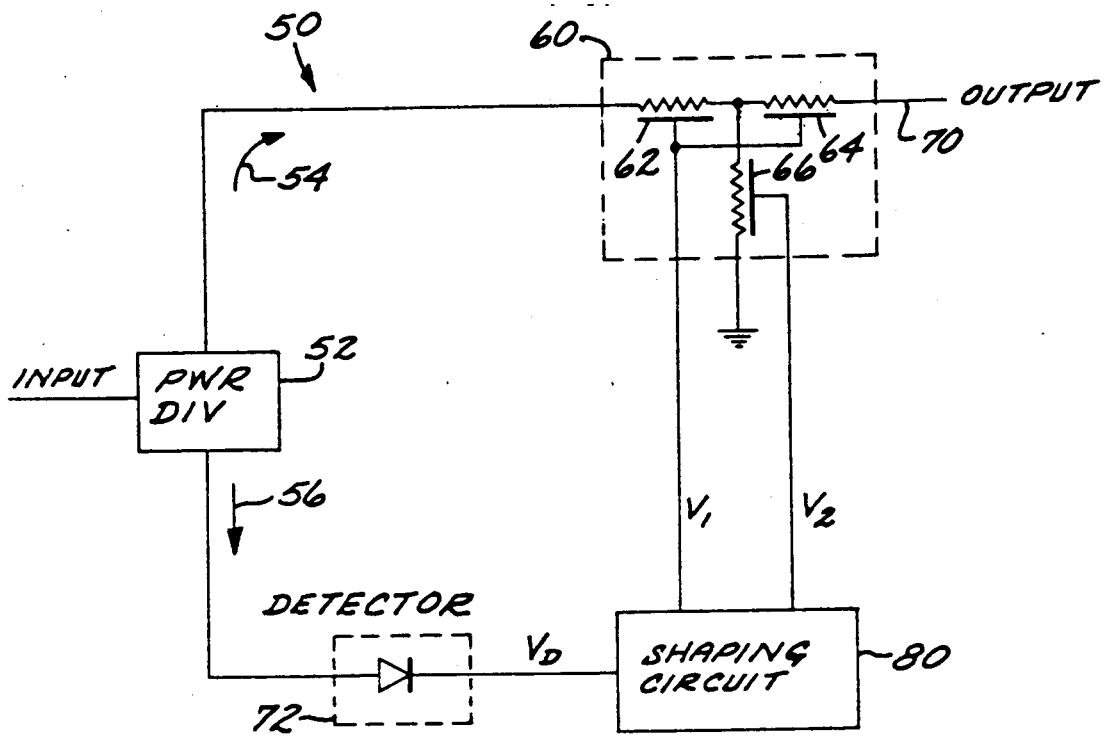
FIG. 1 is a functional block diagram of an AGC circuit employing the invention.

A functional block diagram of an AGC circuit 50 embodying the invention is shown in FIG. 1. The circuit 50 comprises a two-way power divider 52 which splits the input signal into two channels 54 and 56. One channel output is connected to a voltage controlled attenuator 60. The GaAs devices 62, 64 and 66 comprising the attenuator 60 function as voltage variable resistor elements and are configured in a T attenuator configuration. By appropriate selection of the series (62, 64) and shunt (66) elements, the attenuator 60 can provide variable attenuation while maintaining a constant input and output impedance.

Power dividers suitable for use as divider 52 are commercially available, such as the model DS-331 available from Adams Russell, 80 Cambridge Street, Burlington, Mass. 01083. This power divider splits the input power equally between the two channels 54 and 56. Other power split ratios could be used, provided the gains in the feed forward loop are appropriately adjusted.

Attenuators suitable for the purpose of device 60 are commercially available, such as the model MA4GM301 GaAs attenuator device available from MACOM, 100 Chelmsford Street, Lowell, Mass. 01851. This device comprises the three GaAs field effect transistors (FETs) 62, 64 and 66, which are depletion mode devices and are used as voltage variable resistors. The GaAs FET is a three terminal device with the gate being the control element. The gate is inherently isolated from the conducting channel, while charge present at the gate controls the resistance of the channel. As the gate bias of the FET is made more negative than the source, the FET channel resistance increases. The resistance of the FET devices can be changed in less than a nanosecond. These devices also provide very low capacitance from source to drain, and therefore approach the performance of ideal resistors.

Other types of attenuator device could be used in a similar attenuator configuration. For example, PIN diodes could be employed, but would require additional circuit elements such as resistors or inductors to couple control current through the device while isolating the RF path. In contrast, the conducting channel of the GaAs FET device is inherently isolated from the control gate.

Figure 2:
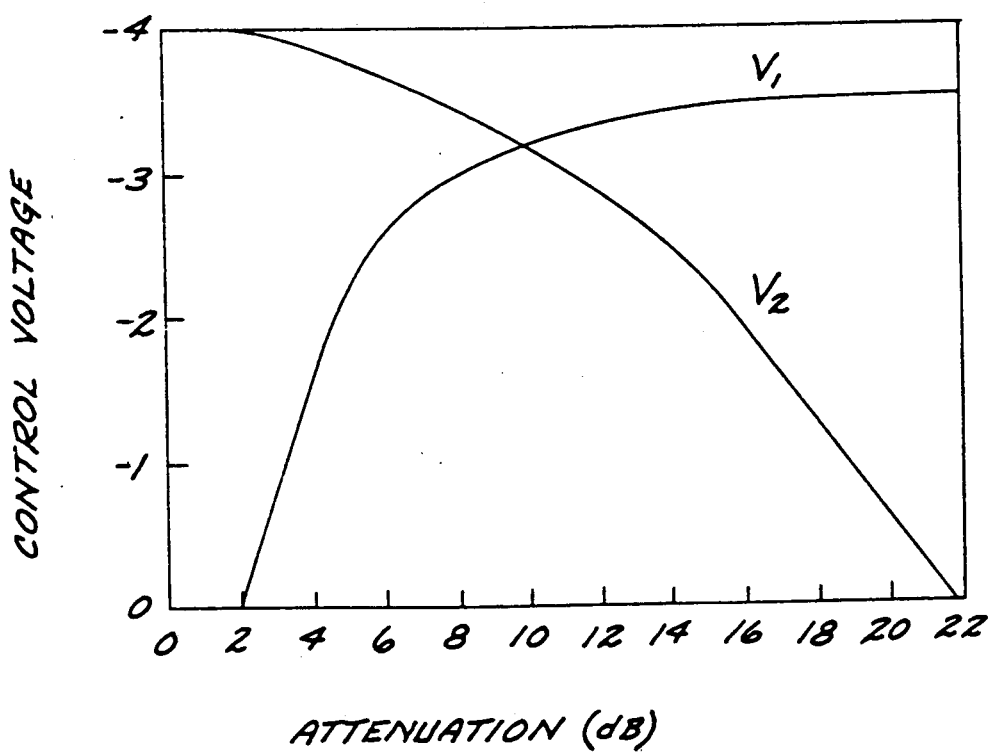
FIG. 2 is a plot of the control voltages versus attenuation for a GaAs attenuator employed in the AGC circuit of FIG. 1.

A plot of attenuation versus both the attenuator series control voltage $V_1$ and shunt control voltage $V_2$ for the attenuator 60 is shown in FIG. 2. When driven with these voltages, the attenuator provides an attenuation range of 20 dB and a constant characteristic impedance of 50 ohms. The constant characteristic impedance provides the characteristic of low attenuator phase shift versus attenuation. FIG. 3 shows a plot of the control voltages $V_1$, $V_2$ as a function of the input signal level (dBm). Thus, the resistance of the series devices 62, 64 is greatest for the maximum input signal level, and is reduced as the input signal level decreases. The resistance of the shunt device 66 is least for the maximum input signal level, and increases as the input signal level decreases.

The other power divider output channel 56 drives a low-level RF diode detector 72 which operates in the "square-law" region and provides a voltage output $V_D$ closely proportional to the input power of the input microwave signal. The detected voltage $V_D$ is then applied to the shaping circuit 80. Diode detectors suitable for use as detector 72 are commercially available, such as the model ACTM-1001 available from Advanced Control Components, P.O. Box 4928, Clinton, N.J. 08809.

A simplified schematic of the shaping circuit 80 is shown in FIG. 4. In this circuit, inverting amplifier A1 increases the level of the detector output $V_D$ and drives inverting amplifier A2 and non-inverting amplifier A3. The output of amplifier A2 drives a first shaping circuit 82 comprising resistors R7, R8, R9 and R10 and diode D1. The control signal $V_2$, at the output of circuit 82, can be adjusted to provide a characteristic closely resembling that of signal $V_2$ in FIGS. 2 and 3. Amplifier A3 drives a similar second shaping circuit 84 comprising resistors R13, R14, R15 and R16 and diode D3. The control signal $V_1$, at the output of circuit 84, can also be adjusted to closely resemble the control signals $V_1$ in FIGS. 2 and 3. Diodes D2 and D4 prevent $V_1$ and $V_2$ from going sufficiently positive to damage the attenuator 60.

The gains of amplifiers A1, A2, and A3 are carefully selected so that as the signal power into the power divider 52 is varied, the voltages $V_1$ and $V_2$ increase or the attenuation as required to maintain a constant output signal level. The devices selected for amplifiers A1-A3 are wide bandwidth devices with settling times of better than 20 nanoseconds. Amplifier devices suitable for use as amplifiers A1-A3 are commercially available; for example the model EL2022 devices available from Elantec, Inc., 1996 Tarob Court, Milpitas, Calif. 95035, are suitable for the purpose. With the use of such shaper circuit elements, in combination with the GaAs attenuator 60 and diode detector 72, AGC circuit response times of faster than 50 nanoseconds are achievable.

For a particular AGC application wherein the microwave input signal has a frequency of 1.3 GHz, the following exemplary resistance values may be used in the circuit of FIG. 4 to provide an AGC circuit bandwidth of greater than 500 MHz.

| Resistor | Value (Ohms) |
| --- | --- |
| R1 | 100 |
| R2 | 2000 |
| R3 | 3600 |
| R4 | 500 ohm potentiometer |
| R5 | 150 |
| R6 | 680 |
| R7 | 100 ohm potentiometer |
| R8 | 50 |

-continued

| Resistor | Value (Ohms) |
| --- | --- |
| R9 | 10 |
| R10 | 510 |
| R11 | 330 |
| R12 | 820 |
| R13 | 100 ohm potentiometer |
| R14 | 50 |
| R15 | 10 |
| R16 | 510 |

By way of example only, the circuit of FIGS. 1 and 3 could be used in such applications as an adaptive antenna combiner system, which requires a constant signal level to function properly. The AGC circuit described above is capable of providing a constant signal level output when fast input pulses (100 nanoseconds) are received. While the circuit of FIGS. 1 and 4 provides 20 dB of AGC range, additional range can be obtained, e.g., by cascading identical AGC circuit stages.

It is understood that the above-described embodiment is merely illustrative of the possible specific embodiments which may represent principles of the present invention. Other arrangements may readily be devised in accordance with these principles by those skilled in the art without departing from the scope of the invention.

What is claimed is:

1. An automatic gain control circuit for input microwave signals, comprising:
   means for splitting the input microwave signal into first and second signal paths;
   a monolithic GaAs voltage controlled variable RF attenuator disposed in the first signal path to selectively attenuate the microwave signal in the first path in response to attenuator control signals, the attenuation factor of said attenuator dependent on said control signals, and wherein said attenuator comprises first and second series variable resistance devices and a first shunt variable resistance device arranged in a T attenuator configuration; and
   a feed forward control loop for controlling said attenuator, comprising:
   an RF detector responsive to the microwave signal in the second path for providing a detector signal indicative of the power of the input microwave signal; and
   circuit means responsive to said detector signals for generating said attenuator control signals so as to increase or decrease the attenuation factor of said attenuator as required to maintain a constant output signal level from the attenuator, said circuit means comprising means for controlling said shunt device to provide maximum shunt device attenuation for the minimum input signal power and minimum shunt device attenuation for the maximum input signal power, and for controlling said series devices to provide maximum series device attenuation for the maximum input signal power, and the minimum series device attenuation for the minimum input signal power.

2. The automatic gain control circuit of claim 1 wherein said first and second series variable resistance devices are controlled by a first attenuator control signal and said shunt variable resistance device is controlled by a second attenuator control signal, and wherein said circuit means comprises means responsive to said detector signals for generating said first and second attenuator control signals.

3. The automatic gain control circuit of claim 1 wherein said circuit means comprises an analog circuit comprising active, wide bandwidth amplifier devices with rapid settling times of about twenty nanoseconds or less.

4. The automatic gain control circuit of claim 3 wherein said circuit means comprises a first inverting amplifier for inverting and amplifying said detector signal, a first non-inverting amplifier responsive to the output of the first inverting amplifier, a first shaping circuit responsive to the output of the first non-inverting amplifier to generate said first attenuator control signal, a second inverting amplifier responsive to the output of the first inverting amplifier, and a second shaping circuit responsive to the output of the second inverting amplifier to generate said second attenuator control signal.

5. The automatic gain control circuit of claim 1 wherein said RF detector comprises a diode detector operating in the "square law" region to provide a detector voltage signal proportional to the power of the input microwave signal.

6. The automatic gain control circuit of claim 1 wherein said means for splitting the input microwave signal comprises a power divider for dividing the input signal into two signals of equal power.

7. The automatic gain control circuit of claim 1 wherein said variable RF attenuator presents a substantially constant characteristic impedance over the attenuation range of said attenuator.

8. An automatic gain control circuit for input microwave signals, comprising:
   means for splitting the input microwave signal into first and second signal paths;
   a variable RF attenuator disposed in the first signal path to selectively attenuate the microwave signal in the first path in response to attenuator control signals, the attenuation factor of said attenuator dependent on said control signals, and wherein said attenuator comprises at least one series variable resistance device controlled by a first attenuator control signal and at least one shunt variable resistance device controlled by a second attenuator control signal; and
   a feed forward control loop for controlling said attenuator, comprising:
      an RF detector responsive to the microwave signal in the second path for providing a detector signal indicative of the power of the input microwave signal; and
      circuit means responsive to said detector signals for generating said attenuator control signals so as to increase or decrease the attenuation factor of said attenuator as required to maintain a constant output signal level from the attenuator.

9. The automatic gain control circuit of claim 8 wherein said attenuator comprises first and second series variable resistance devices and a first shunt variable resistance device arranged in a T attenuator configuration, and wherein said shunt device is controlled to provide maximum shunt device attenuation for the minimum input signal power and minimum shunt device attenuation for the maximum input signal power, and said series devices are controlled to provide maximum series device attenuation for the maximum input signal power, and the minimum series device attenuation for the minimum input signal power.

10. The automatic gain control circuit of claim 9 wherein said series and shunt variable resistance devices comprise GaAs field effect transistors fabricated on monolithic substrate.

11. The automatic gain control circuit of claim 10 wherein said circuit means comprises a first inverting amplifier for inverting and amplifying said detector signal, a first non-inverting amplifier responsive to the output of the first inverting amplifier, a first shaping circuit responsive to the output of the first non-inverting amplifier to generate said first attenuator control signal, a second inverting amplifier responsive to the output of the first inverting amplifier, and a second shaping circuit responsive to the output of the second inverting amplifier to generate said second attenuator control signal.

12. The automatic gain control circuit of claim 8 wherein said series and shunt variable resistance devices comprise GaAs field effect transistors.

13. The automatic gain control circuit of claim 8 wherein said series and shunt variable resistance devices comprise GaAs field effect transistors fabricated on a monolithic substrate.

* * * * *